United States Patent
Klipp et al.

(10) Patent No.: US 9,236,256 B2
(45) Date of Patent: Jan. 12, 2016

(54) USE OF SURFACTANTS HAVING AT LEAST THREE SHORT-CHAIN PERFLUORINATED GROUPS RF FOR MANUFACTURING INTEGRATED CIRCUITS HAVING PATTERNS WITH LINE-SPACE DIMENSIONS BELOW 50 NM

(75) Inventors: Andreas Klipp, Lambsheim (DE); Dieter Mayer, Darmstadt (DE)

(73) Assignee: BASF SE, Ludwigshafen (DE)

( * ) Notice: Subject to any disclaimer, the term of this patent is extended or adjusted under 35 U.S.C. 154(b) by 224 days.

(21) Appl. No.: 13/979,076

(22) PCT Filed: Jan. 17, 2012

(86) PCT No.: PCT/IB2012/050218
§ 371 (c)(1),
(2), (4) Date: Jul. 10, 2013

(87) PCT Pub. No.: WO2012/101545
PCT Pub. Date: Aug. 2, 2012

(65) Prior Publication Data
US 2013/0288484 A1 Oct. 31, 2013

Related U.S. Application Data

(60) Provisional application No. 61/435,820, filed on Jan. 25, 2011.

(51) Int. Cl.
| | |
|---|---|
| *C11D 7/50* | (2006.01) |
| *H01L 21/033* | (2006.01) |
| *G03F 7/20* | (2006.01) |
| *G03F 7/004* | (2006.01) |
| *G03F 7/32* | (2006.01) |
| *G03F 7/40* | (2006.01) |
| *C11D 11/00* | (2006.01) |

(52) U.S. Cl.
CPC .......... *H01L 21/0337* (2013.01); *G03F 7/0046* (2013.01); *G03F 7/0048* (2013.01); *G03F 7/2041* (2013.01); *G03F 7/322* (2013.01); *G03F 7/405* (2013.01); *C11D 11/0047* (2013.01)

(58) Field of Classification Search
CPC ..... C11D 11/0047; C11D 1/004; C11D 1/006
USPC ................................................. 510/175, 176
See application file for complete search history.

(56) References Cited

U.S. PATENT DOCUMENTS

| | | | |
|---|---|---|---|
| 6,890,452 | B2 | 5/2005 | Parent et al. |
| 7,063,931 | B2 | 6/2006 | Li et al. |
| 2005/0173682 | A1* | 8/2005 | Zhang et al. ................... 252/582 |
| 2008/0280230 | A1 | 11/2008 | Chang et al. |
| 2008/0299487 | A1 | 12/2008 | Chang |
| 2009/0264525 | A1 | 10/2009 | Hierse et al. |
| 2009/0312432 | A1 | 12/2009 | Hierse et al. |
| 2010/0152081 | A1 | 6/2010 | Hierse et al. |

FOREIGN PATENT DOCUMENTS

| | | |
|---|---|---|
| JP | 2002-148821 | 5/2002 |
| WO | 2004 044092 | 5/2004 |
| WO | 2008 003443 | 1/2008 |
| WO | 2008 003445 | 1/2008 |
| WO | 2008 003446 | 1/2008 |
| WO | 2008 014980 | 2/2008 |
| WO | 2009 149807 | 12/2009 |
| WO | WO 2012/101545 A1 | 8/2012 |

OTHER PUBLICATIONS

International Search Report Issued May 31, 2012 in PCT/IB12/050218 filed Jan. 17, 2012.
U.S. Appl. No. 14/412,737, filed Jan. 5, 2015, Klipp, et al.
Office Action Report issued in corresponding Japanese Application No. 2013-549914 dated Sep. 29, 2015.

* cited by examiner

*Primary Examiner* — Gregory Webb
(74) *Attorney, Agent, or Firm* — Oblon, McClelland, Maier & Neustadt, L.L.P.

(57) ABSTRACT

The use of surfactants A, the 1% by weight aqueous solutions of which exhibit a static surface tension <25 mN/m, the said surfactants A containing at least three short-chain perfluorinated groups Rf selected from the group consisting of trifluoromethyl, pentafluoroethyl, 1-heptafluoropropyl, 2-heptafluoropropyl, heptafluoroisopropyl, and pentafluorosulfanyl; for manufacturing integrated circuits comprising patterns having line-space dimensions below 50 nm and aspect ratios >3; and a photolithographic process making use of the surfactants A in immersion photoresist layers, photoresist layers exposed to actinic radiation, developer solutions for the exposed photoresist layers and/or in chemical rinse solutions for developed patterned photoresists comprising patterns having line-space dimensions below 50 nm and aspect ratios >3. By way of the surfactants A, pattern collapse is prevented, line edge roughness is reduced, watermark defects are prevented and removed and defects are reduced by removing particles.

13 Claims, No Drawings

USE OF SURFACTANTS HAVING AT LEAST THREE SHORT-CHAIN PERFLUORINATED GROUPS RF FOR MANUFACTURING INTEGRATED CIRCUITS HAVING PATTERNS WITH LINE-SPACE DIMENSIONS BELOW 50 NM

The present invention is directed to the novel use of surfactants having at least three short-chain perfluorinated groups Rf for manufacturing integrated circuits (ICs), in particular, ICs having large-scale integration (LSI), very-large-scale integration (VLSI) and ultra-large-scale integration (ULSI), the said ICs having high aspect ratio patterns with line-space dimensions below 50 nm.

CITED DOCUMENTS

The documents cited in the present application are incorporated by reference in their entirety.

BACKGROUND OF THE INVENTION

In the process of manufacturing ICs with LSI, VLSI and ULSI, patterned material layers like patterned photoresist layers, patterned barrier material layers containing or consisting of titanium nitride, tantalum or tantalum nitride, patterned multi-stack material layers containing or consisting of stacks e.g. of alternating polysilicon and silicon dioxide layers, and patterned dielectric material layers containing or consisting of silicon dioxide or low-k or ultra-low-k dielectric materials are produced by photolithographic techniques. Nowadays, such patterned material layers comprise structures of dimensions even below 20 nm with high aspect ratios.

Photolithography is a method in which a pattern on a mask is projected onto a substrate such as a semiconductor wafer. Semiconductor photolithography typically includes the step of applying a layer of a photoresist on a top surface of the semiconductor substrate and exposing the photoresist to actinic radiation, in particular UV radiation of a wavelength of, for example, 193 nm, through the mask. In order to extend the 193 nm photolithography to the 20 nm and the 15 nm node, immersion photolithography has been developed as a resolution enhancement technique. In this technique, the air gap between the final lens of the optical system and the photoresist surface is replaced by a liquid medium that has a refractive index greater than one, e.g., ultra pure water with a refractive index of 1.44 for the wavelength of 193 nm. However, in order to avoid leaching, water-uptake and pattern degradation, a barrier coating or a water resistant photoresist must be used. These measures however add to the complexity of the manufacturing process and are therefore disadvantageous.

A post-exposure bake (PEB) is often performed to allow the exposed photoresist polymers to cleave. The substrate including the cleaved polymer photoresist is then transferred to a developing chamber to remove the exposed photoresist, which is soluble in aqueous developer solutions. Typically, a developer solution such as a tetramethylammonium hydroxide (TMAH) is applied to the resist surface in the form of a puddle to develop the exposed photoresist. A deionized water rinse is then applied to the substrate to remove the dissolved polymers of the photoresists. The substrate is then sent to a spin drying process. Thereafter, the substrate can be transferred to the next process step, which may include a hard bake process to remove any moisture from the photoresist surface.

This conventional process however involves a plurality of problems. As technologies advance and dimension requirements become stricter and stricter, photoresist patterns are required to include relatively thin and tall structures or features of photoresists, i.e., features having a high aspect ratio, on the substrate. These structures may suffer from bending and/or collapsing, in particular, during the spin dry process, due to excessive capillary forces of the deionized water remaining from the chemical rinse and spin dry processes and being disposed between adjacent photoresist features. The maximum stress σ between small features caused by the capillary forces can be defined as follows:

$$\sigma = 6 \cdot \gamma \cdot \cos \theta / D \cdot (H \cdot W)^2,$$

wherein γ=surface tension of the fluid, θ=contact angle of the fluid on the feature material surface, D=distance between the features, H=height of the features, and W width of the features. Consequently, the surface tension of the chemical rinse solutions must be significantly lowered.

Another solution for immersion lithography may include using a photoresists with modified polymers to make it more hydrophobic. However, this solution may decrease the wettability of the developing solution.

Another problem of the conventional photolithographic process is line edge roughness (LER) due to resist and optical resolution limits. LER includes horizontal and vertical deviations from the feature's ideal form. Especially as critical dimensions shrink, the LER becomes more problematic and may cause yield loss in the manufacturing process of IC devices.

Due to the shrinkage of the dimensions, the removal of particles in order to achieve a defect reduction becomes also a critical factor. This does not only applied to photoresist patterns but also to other patterned material layers.

An additional problem of the conventional photolithographic process is the presence of watermark defects. Watermarks may form on the photoresist as the deionized water from the deionized water rinse cannot be spun off from the hydrophobic surface of the photoresist. The photoresist may be hydrophobic particularly in areas of isolated, or non-dense, patterning. The watermarks have a harmful effect on yield and IC device performance.

The American patent application US 2008/0280230 A1 discloses a chemical rinse solution containing an alcohol, in particular, isobutyl alcohol. Moreover, the chemical rinse solution may contain fluorosurfactants such as 3M Novec™ fluid HFE-711PA, -7000, -7100, -7200, and 7500, 3M Fluorinert™ FC-72, -84, -77, -3255, -3283, -40, -43, -70, -4432, 4430, and -4434, or 3M Novec™ 4200 and 4300.

For instance, 3M Novec™ 4200 is a perfluoroalkyl sulfonamide, 3M Novec™ 4300 is a perfluoroalkyl sulfonate, HFE-7000 is heptafluoro-3-methoxypropane, HFE-7100 is nonafluoro-4-methoxybutane, HFE-7200 is 1-ethoxy-nonafluorobutane, HFE-7500 is 3-methoxy-dodecafluoro-2-(trifluoromethyl)-hexane, and HFE-711PA is an azeotrope of 1-methoxy-nonafluorobutane and isopropanol. The 3M Fluorinert™ series surfactants are customarily used as inert perfluorinated heat transfer media.

The American patent application US 2008/0299487 A1 teaches the use of the above mentioned fluorosurfactants as additives to developer and chemical rinse solutions as well as to the immersion photoresist material. Moreover, 3M L-18691, an aqueous solution of perfluoroalkyl sulfonimide, can also be used. Additionally, the use of the following fluorosurfactants is suggested:

Rf—$SO_3^-M^+$, wherein Rf is a C1-C12 perfluoroalkyl group and $M^+$ is a cation, a proton or an ammonium group;

Rf—SO$_2$N$^-$—R$^1$M$^+$, wherein Rf and M$^+$ have the above-mentioned meaning and R$^1$ is a hydrogen atom, an alkyl group, a hydroxyalkyl group, an alkylamine oxide group, an alkylcarboxylate group or an aminoalkyl group, the alkyl, hydroxyalkyl, alkylamine oxide, alkylcarboxylate and aminoalkyl groups having preferably 1-6 carbon atoms and the hydroxyalkyl having preferably the formula —(CH$_2$)$_x$—OH, wherein x=1-6; and Rf-Q-R$^1$SO$_3^-$M$^+$, wherein Rf and M$^+$ have the above-mentioned meaning and R$^1$ is an alkylene of the formula —C$_n$H$_{2n}$(CHOH)$_o$C$_m$H2$_m$—, wherein n and m are independently of each other 1-6 and o is 0-1, and is optionally substituted by catenary oxygen or nitrogen group, Q is —O— or —SO$_2$NR$^2$—, wherein R$^2$ is a hydrogen atom, or an alkyl, aryl, hydroxyalkyl, aminoalkyl, or a sulfonatoalkyl group having 1-6 carbon atoms, optionally containing one or more catenary oxygen or nitrogen heteroatoms; the hydroxyalkyl group may be of the formula —C$_p$H$_{2p}$—OH, wherein p is 1-6; the aminoalkyl group may be of the formula —C$_p$H$_{2p}$—NR$^3$R$^4$, wherein p is 1-6 and R3 and R4 are independently of each other hydrogen atoms or alkyl groups of 1-6 carbon atoms.

Although the prior art chemical rinse solutions containing such fluorosurfactants constitute an improvement over the conventional aqueous chemical rinse solutions, there is still room for improvements to meet the ever increasing demands of the IC manufacturing industry, in particular with regard to pattern collapse in the sub-20 nm technology nodes. Moreover, many of these prior art fluorosurfactants are not easily biodegradable and are therefore prone to bioaccumulation.

The international patent applications WO 2008/003443 A1, WO 2008/003445 A1, WO 2008/003446 A2 and WO 2009/149807 A1 and the American patent application US 2009/0264525 A1 disclose inter alia fluorosurfactants containing at least 3 short-chain perfluorinated groups Rf and/or pentafluorosulfanyl groups. These known fluorosurfactants find numerous applications, for example, in textile, paper, glass, building, coating, cleaner, cosmetic, herbicide, pesticide, fungicide, adhesive, metal, or mineral oil technologies as well as in special coatings for semiconductor photolithography (photoresist, top antireflective coatings, bottom antireflective coatings) [cf., for example WO 2008/003446 A2, page 14, line 29 to page 20, line 20]. The use of the fluorosurfactants for manufacturing ICs for nodes below 50 nm, in particular for 32 nm nodes and lower, are not disclosed.

OBJECTS OF THE INVENTION

It is the object of the present invention to provide a novel use for fluorosurfactants containing at least three short-chain perfluorinated groups Rf and/or pentafluorosulfanyl groups.

In particular, the novel use of the said fluorosurfactants should allow for the immersion photolithography of photoresist layers, the developing of photoresist layers exposed to actinic radiation through a mask and/or the chemical rinse of patterned material layers comprising patterns with a high aspect ratio and dimensions of 50 nm and less, in particular 32 nm and less, without causing pattern collapse, line edge roughness (LER) and watermark defects. Quite to the contrary, the novel use should allow for a significant reduction of LER by smoothing the roughness of the surfaces of the developed photoresist patterns caused by interference effects, for the efficient prevention and/or the removal of watermark defects not only on photoresist patterns but also on other patterned material layers, and the efficient removal of particles in order to achieve a significant defect reduction not only on photoresist patterns but also on other patterned material layers.

Moreover, it is another object of the present invention to provide a novel photolithographic process which allows for the immersion photolithography of photoresist layers, the development of the exposed photoresist layers and the chemical rinse of patterned developed photoresist layers without causing pattern collapse, line edge roughness (LER) and watermark defects. Quite to the contrary, the novel photographic process should allow for a significant reduction of LER by smoothing the roughness of the surfaces of the developed photoresist patterns caused by interference effects, for the efficient prevention and/or the removal of watermark defects not only on photoresist patterns but also on other patterned material layers, and the efficient removal of particles in order to achieve a significant defect reduction not only on photoresist patterns but also on other patterned material layers.

SUMMARY OF THE INVENTION

Accordingly, the new use of surfactants A; for manufacturing integrated circuits having patterns having line-space dimensions below 50 nm and aspect ratios >3 has been found, the 1% by weight aqueous solutions of the said surfactants having a static surface tension <25 mN/m and the said surfactants A containing at least three short-chain perfluorinated groups Rf selected from the group consisting of trifluoromethyl, pentafluoroethyl, 1-heptafluoropropyl, 2-heptafluoropropyl, heptafluoroisopropyl, and pentafluorosulfanyl.

Hereinafter, the new use of the surfactants A is referred to as the "use of the invention".

Moreover, the new photolithographic process has been found, the said process comprising the steps of
(1) providing a substrate having an immersion photoresist layer;
(2) exposing the photoresist layer to actinic radiation through a mask and the immersion liquid;
(3) developing the exposed photoresist layer with a developer solution to obtain a pattern having line-space dimensions below 50 nm and aspect ratios >3;
(4) applying a chemical rinse solution to the developed patterned photoresist layer; and
(5) spin drying the substrate after the application of the chemical rinse solution.
wherein the immersion photoresist layer, the developer solution and/or the chemical rinse solution comprises or comprise at least one surfactant A, the 1% by weight aqueous solution of which exhibits a static surface tension <25 mN/m, the said surfactant A containing at least three short-chain perfluorinated groups Rf selected from the group consisting of trifluoromethyl, pentafluoroethyl, 1-heptafluoropropyl, 2-heptafluoropropyl, and pentafluorosulfanyl groups.

Hereinafter the new photolithographic process is referred to as the "process of the invention".

ADVANTAGES OF THE INVENTION

In view of the prior art, it was surprising and could not be expected by the skilled artisan that the objects of the invention could be solved by the use and the process of invention.

It was particularly surprising that the use of the invention allowed for the immersion photolithography of photoresist layers, the developing of photoresist layers exposed to actinic radiation through a mask and/or the chemical rinse of patterned material layers, in particular, patterned developed photoresist layers, comprising patterns having line-space dimensions below 50 nm, particularly 32 nm and less, and most particularly 20 nm and less, and aspect ratios >3 without causing pattern collapse, line edge roughness (LER) and watermark defects. Quite to the contrary, the use of the invention allowed for a significant reduction of LER by smoothing the roughness of the surfaces of the developed photoresist patterns caused by interference effects, for the efficient prevention and/or the removal of watermark defects not only on photoresist patterns but also on other patterned material layers, and the efficient removal of particles whereby a significant defect reduction not only on photoresist patterns but also on other patterned material layers could be achieved.

Moreover, it was surprising that the process of the invention allowed for the immersion photolithography of photoresist layers, the development of the exposed photoresist layers and the chemical rinse of patterned developed photoresist layers comprising patterns having line-space dimensions below 50 nm, particularly 32 nm and less, and most particularly 20 nm and less, and aspect ratios >3 without causing pattern collapse, line edge roughness (LER) and watermark defects. Quite to the contrary, the process of the invention allowed for a significant reduction of LER by smoothing the roughness of the surfaces of the developed photoresist patterns caused by interference effects, for the efficient prevention and/or the removal of watermark defects not only on photoresist patterns but also on other patterned material layers, and the efficient removal of particles whereby a significant defect reduction not only on photoresist patterns but also on other patterned material layers could be achieved.

In addition to this, the surfactants A used in accordance with the use of the invention and in the process of the invention were biodegradable and showed no bioaccumulation.

DETAILED DESCRIPTION OF THE INVENTION

In its broadest aspect, the present invention is directed to the use of the especially selected surfactants A in manufacturing ICs, in particular ICs with LSI, VLSI and/or ULSI, comprising patterns having line-space dimensions below 50 nm and aspect ratios >3.

In particular, the surfactants A are used as additives in immersion photoresists in order to increase the resist layers' resistance to the immersion liquids and to water contained in the developer solutions or the chemical rinse solutions, preferably as additives in the chemical rinse solutions.

The developer solutions are used for developing photoresist layers exposed to actinic radiation through a mask. Preferably, UV irradiation of a wavelength of 193 nm is used.

The chemical rinse solutions are used for rinsing patterned material layers comprising patterns having line-space dimensions below 50 nm and aspect ratios >3.

More preferably, the chemical rinse solutions are used for rinsing patterns having line-space dimensions of 32 nm and lower and, even more preferably, line-space dimensions of 20 nm and lower, i.e. patterns for the sub-20 nm technology nodes.

More preferably, the chemical rinse solutions are used for rinsing patterns having aspect ratios >10, even more preferably >50. Most preferably, the aspect ratio is in the range of up to 75, as for example, for 15 nm flash devices.

The patterned material layers can be patterned photoresist layers, patterned barrier material layers containing or consisting of titanium nitride, tantalum or tantalum nitride, patterned multi-stack material layers containing or consisting of layers of at least two different materials selected from the group consisting of silicon, polysilicon, silicon dioxide, low-k and ultra-low-k materials, high-k materials, semiconductors other than silicon and polysilicon and metals; and patterned dielectric material layers containing or consisting of silicon dioxide or low-k or ultra-low-k dielectric materials.

1% by weight, preferably 0.1% by weight, more preferably 0.01% by weight and most preferably 0.002% by weight aqueous solutions of the surfactants A to be used according to the use of the invention exhibit a static surface tension <25 mN/m and more preferably <20 mN/m. The static surface tension can be measured as described, for example, in the American patent application US 2009/0264525 A1, Example 10, Determination of the Surface Tension, page 30, paragraph [0302] only that the above-mentioned concentrations are used.

The surfactants A contain at least three, preferably three short-chain perfluorinated groups Rf selected from the group consisting of trifluoromethyl, pentafluoroethyl, 1-heptafluoropropyl, 2-heptafluoropropyl, and pentafluorosulfanyl, preferably pentafluoroethyl and 1-heptafluoropropyl.

Preferably, the perfluorinated groups Rf are bonded to the same multi-valent, preferably four-valent central moiety B.

The central moiety B can be a carbon atom, an alkyl group, preferably having 2-16 carbon atoms, a monocyclic or polycyclic cycloalkyl group, preferably having 5-12 carbon atoms, and mononuclear or polynuclear aryl group, preferably having 6-18 carbon atoms.

The cycloalkyl groups B and the aryl groups B may contain at least one heteroatom selected from the group consisting of oxygen, sulfur, nitrogen and phosphorus. However, it is preferred that such groups B contain only one or no heteroatom so that the hydrophobicity of the central moiety B is not affected.

The alkyl groups and the cycloalkyl groups B may contain at least one multiple bond selected from double bonds and triple bonds. The number of double bonds and/or triple bonds is chosen such that the central moiety B does not become too reactive so that undesired reactions like decomposition, thermally initiated polymerization, polymerization initiated by actinic radiation, reaction with immersion liquids with photoresists and/or other components of the developer solutions and the chemical rinse solutions are avoided.

Most preferably, the perfluorinated groups Rf are bonded to the same carbon atom of an alkyl group B.

Suitable alkyl groups B are derived from ethane, propane, isopropane, butane, 2-methyl propane, pentane, isopentane, neopentane, hexane, 2- and 3-methyl hexane, heptane, octane, isooctane, nonane, decane, undecane, dodecane tridecane, tetradecane, pentadecane, and hexadecane.

Most preferably, the perfluorinated groups Rf are bonded to the same ring of the polynuclear cycloalkyl and aryl groups B.

Suitable cycloalkyl groups B are derived from cyclopentane, cyclohexane, cyclopentyl cyclohexane, cyclohexyl cyclohexane, spiro[3.4]octane, spiro[4.4]nonane, spiro[5.4]decane, spirobicyclohexane, norbonane, biyclo[3.2.1]octane, and adamantane.

Suitable aryl groups are derived from benzene, biphenyl, o-, m- and p-terphenyl, naphthalene, anthracene, phenanthrene, and fluoranthene.

The central moiety B most preferably used is a carbon atom and a benzene ring.

In the surfactant A, the perfluorinated groups Rf are bonded to the multi-valent central moiety B via a linker X selected from the group consisting of covalent bonds, silicon atoms, nitrogen atoms, phosphorus atoms, oxygen atoms, sulfur atoms and bivalent organic linking groups L.

Preferably, the bivalent organic linking groups L are selected from the group consisting of short-chain linear alkylene groups, preferably having 1-4 carbon atoms, e.g., methylene, ethylene, trimethylene, and butane1,4-diyl; —C(O)—, —C(S)—, —C(O)—O—, —O—C(O)—O—, —O—C(S)—O—, —O—Si(—R)$_2$—, —NR—, —N=N—, —NR—C(O)—, —NR—NR—C(O)—, —NR—NR—C(S)—, —O—C(O)—NR—, —O—C(S)—NR—, —NR—C(O)—NR—, —NR—C(S)—NR—, —S—, —S(O)—, —S(O)$_2$—, —O—S(O)$_2$—, and —NR—S(O)$_2$—.

The bivalent organic linking groups L are chosen such that they do not affect the hydrophobicity of the hydrophobic group D hereinafter described.

Most preferably, the linker X is selected from the group consisting of covalent bonds and nitrogen atoms.

The perfluorinated groups Rf, the linkers X and the central moiety B constitute the hydrophobic group D of the general formula I:

$$(RfX—)_nB— \quad (I),$$

wherein the index n is an integer of at least 3, preferably 3.

Examples for suitable hydrophobic groups D of the general formula I are (CF$_3$—)$_3$C—;
(C$_2$F$_5$—)$_3$C—;
(CF$_3$CF$_2$CF$_2$—)$_3$C—;
[(CF$_3$)$_2$CF—]$_3$C—;
[(CF$_3$)$_2$N—]$_2$CH—;
(CF$_3$—)$_3$C$_6$H$_2$—, wherein the groups Rf are in the 2,4,6-, 2,3,6-, 2,3,5-, 2,3,4-, or 3,4,5-position;
(C$_2$F$_5$—)$_3$C$_6$H$_2$—, wherein the groups Rf are in the 2,4,6-, 2,3,6-, 2,3,5-, 2,3,4-, or 3,4,5-position;
(CF$_3$CF$_2$CF$_2$—)$_3$C$_6$H$_2$—, wherein the groups Rf are in the 2,4,6-, 2,3,6-, 2,3,5-, 2,3,4-, or 3,4,5-position;
[(CF$_3$)$_2$CF—]$_3$C$_6$H$_2$—, wherein the groups Rf are in the 2,4,6-, 2,3,6-, 2,3,5-, 2,3,4-, or 3,4,5-position;
[(CF$_3$)$_2$N—]$_2$C$_6$H$_3$—, wherein the groups Rf are in the 2,6-, 2,5-, 2,4-, 2,3-, or 3,4-position; or
(SF$_5$—)$_3$C$_6$H$_2$—, wherein the groups Rf are in the 2,4,6-, 2,3,6-, 2,3,5-, 2,3,4-, or 3,4,5-position.

Most preferably, (CF$_3$—)$_3$C—, (C$_2$F$_5$—)$_3$C—, and (CF$_3$CF$_2$CF$_2$—)$_3$C— and most particularly preferably (CF$_3$CF$_2$CF$_2$—)$_3$C— is or are used as the hydrophobic group D.

In the surfactant A, at least one, preferably one hydrophobic group D is bonded to at least one hydrophilic group E.

The hydrophilic group E is selected from the group consisting of anionic groups, cationic groups and nonionic groups.

Preferably, the anionic groups E are selected from the group consisting of carboxylic acid groups, sulfonic acid groups, sulfuric acid groups, phosphonic acid groups, phosphoric acid groups, carboxylate groups, sulfonate groups, substituted sulfonimide and sulfonamide groups, sulfate groups, phosphonate groups, and phosphate groups, preferably sulfonate groups and negatively charged substituted sulfonimide and sulfonamide groups. Preferably, the counterions are selected from the group consisting of ammonium, primary ammonium, secondary ammonium, tertiary ammonium and quaternary ammonium groups and lithium, sodium and potassium cations, in particular sodium cations.

Preferably, the cationic groups E are selected from the group consisting of primary, secondary, tertiary and quaternary ammonium groups, quaternary phosphonium groups and tertiary sulfonium groups. Preferably, the counterions are selected from anions derived from volatile organic and inorganic acids, preferably formic acid, acetic acid and HCl.

When the hydrophilic group E consists only of the anionic or cationic groups E the said groups are directly bonded to the central moiety B described above, i.e., the linker Y is a covalent bond.

Preferably, the nonionic groups E are selected from the group consisting of hydroxy groups, groups having at least one hydroxy group and cyclic, linear and branched ether groups.

When the hydrophilic group E consists only of the hydroxy group the said group is directly bonded to the central moiety B described above, i.e., the linker Y is a covalent bond.

More preferably, the groups E having at least one hydroxy group are derived from polyhydroxy compounds selected from the group consisting, ethylene glycol, propylene glycol, diethylene glycol, triethylene glycol, dipropylene glycol, tripropylene glycol, ethylene propylene glycol, diethylene propylene glycol, ethylene dipropylene glycol, glycerol, 1,2,3-trihydroxy-n-butane, trimethylolpropane, erythritol, threitol pentaerythritol, di-, tri-, tetra-, penta-, hexa-, hepta-, octa-, nona-, deca-, undeca- and dodecaglycerol, -trimethylolpropane, -erythritol, -threitol and -pentaerythritol; arabinitol, ribitol and xylitol, galactitol, mannitol, glucitol, allitol, altritol, maltitol, isomalt, lactitol, iditol, 1,2,3,4-tetrahydroxycyclohexane, 1,2,3,4,5-pentahydroxycyclohexane, myo-, scyllo-, muco-, chiro-, neo-, allo-, epi- and cis-inositol, allose, altrose, glucose, mannose, idose, galactose and talose, sorbitan, and 1,5- and 1,4-sorbitan esters. Additional suitable hydroxy compounds are described in the American patent application US 2009/0264525 A1, page 2, paragraphs [0019] to [0026].

More preferably, the cyclic ether groups E are derived from cyclic ethers selected from the group consisting of tetrahydrofurane, tetrahydropyrane, and 1,4-dioxane.

More preferably, the linear and branched ether groups E are derived from polyethers selected from the group consisting of diethylene glycol, triethylene glycol, dipropylene glycol, tripropylene glycol, polyethyleneoxide preferably having a degree of polymerization of 4-100, and ethoxylated polyhydroxy compounds, in particular the polyhydroxy compounds described above.

The hydrophilic groups E may be combined in any suitable manner. Thus, the hydrophilic groups E may contain anionic and cationic groups so that amphoteric or zwitterionic hydrophilic groups E result of. Likewise, the nonionic groups E may be combined with any one of the cationic and/or the anionic groups E.

In the surfactant A, the hydrophobic group D is bonded to the hydrophilic group E via a linker Y, thus constituting the surfactant A of the general formula II:

$$(DY—)_mE \quad (II),$$

wherein the index m is an integer of at least 1.

The linker Y is selected from the group consisting of covalent bonds, silicon atoms, nitrogen atoms, phosphorus atoms, oxygen atoms, sulfur atoms and the above described bivalent linking groups L.

Suitable surfactants A which can be used in accordance with the use of the invention and methods for their preparation are described, for example, in the international patent applications WO 2008/003443 A1, page 3, line 1 to page 14, line 12 in conjunction with page 90, line 11 to page 144, line 28;
WO 2008/003445 A1, page 3, line 20 to page 40, line 11 in conjunction with page 49, line 1 to page 62, line 28;
WO 2008/003446 A1, page 3, line 21 to page 14, line 28 in conjunction with page 22, line 11 to page 88, line 2; and WO 2009/14980 A1, page 3, line 4 to page 5, line 13 in conjunction with page 6, line 26, to page 13, line 9; and in the American patent application US 2009/0264525 A1, page 1, paragraph [0001], page 1, paragraph [0012] to page 20, [0171] in conjunction with page 22, paragraph [0206] to page 30, paragraph [0303]. Most preferably, tris(pentafluoroethyl)methane sulfonic acid sodium salt and homologues of tris(pentafluoroethyl)methane sulfonic acid sodium salt having a molecular weight of up to 2000 Dalton, preferably 1500 Dalton, more preferably 1250, and most preferably 900 Dalton, wherein the sulfonate group is linked with the tris(pentafluoroethyl) methyl group via a bivalent polyoxyethylene group;

tris(pentafluoroethyl)benzene sulfonic acid sodium salt and homologues of tris(pentafluoroethyl)benzene sulfonic acid sodium salt having a molecular weight of up to 2000 Dalton, preferably 1500 Dalton, more preferably 1250, and most preferably 1000 Dalton, wherein the sulfonate group is linked with the tris(pentafluoroethyl)phenyl group via a bivalent polyoxyethylene group;

tris(heptafluoroprop-1-yl)methane sulfonic acid sodium salt and homologues of tris(heptafluoroprop-1-yl)methane sulfonic acid sodium salt having a molecular weight of up to 2000 Dalton, preferably 1500 Dalton, more preferably 1250, and most preferably 1000 Dalton, wherein the sulfonate group is linked with the tris(heptafluoroprop-1-yl)methyl group via a bivalent polyoxyethylene group; and tris(heptafluoroprop-1-yl)benzene sulfonic acid sodium salt and homologues of tris(heptafluoroprop-1-yl)benzene sulfonic acid sodium salt having a molecular weight of up to 2000 Dalton, preferably 1500 Dalton, more preferably 1250, and most preferably 1000 Dalton, wherein the sulfonate group is linked with the tris(heptafluoroprop-1-yl)phenyl group via a bivalent polyoxyethylene group are used as surfactants A.

The surfactants A particularly well-suited for the process of the invention.

The process of the invention comprises the steps of
(1) providing a substrate having an immersion photoresist layer;
(2) exposing the photoresist layer to actinic radiation through a mask and an immersion liquid;
(3) developing the exposed photoresist layer with a developer solution;
(4) applying a chemical rinse solution to the developed patterned photoresist layer to obtain a pattern having line-space dimensions below 50 nm, preferably 32 nm and lower and, most preferably, 20 nm and lower; and aspect ratios >3, preferably >10, even more preferably >50 and most preferably up to 75; and
(5) spin drying the substrate after the application of the chemical rinse solution.

Any customary and known substrates used for manufacturing IC devices, optical devices, micromachines and mechanical precision devices can be used in the process of the invention. Preferably, the substrate is a semiconductor substrate, more preferably a silicon wafer including a silicon-gallium wafer, which wafers are customarily used for manufacturing IC devices, in particular IC devices with LSI, VLSI and ULSI.

Any customary and known immersion photoresist can be used. The immersion photoresist may already contain at least one surfactant A. Additionally, the immersion photoresists can contain additional surfactants. Suitable additional surfactants are described, for example, in the American patent application US 2008/0299487 A1, page 6, paragraphs [0078] and [0079]. Most preferably, the immersion photoresist is a positive resist.

Preferably, UV radiation of the wavelength of 193 nm is used as actinic radiation.

Preferably, ultra-pure water is used as the immersion liquid.

Any customary and known developer solutions can be used for developing the exposed photoresist layer. Preferably, aqueous developer solutions containing tetramethylammonium hydroxide (TMAH) are used. More preferably, the aqueous developer solutions contain at least one surfactant A.

Preferably, the chemical rinse solutions are aqueous solutions. More preferably, the aqueous developer solutions contain at least one surfactant A.

Preferably, the chemical rinse solutions are applied to the exposed and developed photoresist layers as puddles.

It is essential for the process of the invention, that at least one of immersion photoresist, developer solution or chemical rinse solution contains at least one surfactant A. Most preferably, the at least one surfactant A is contained in the chemical rinse solution.

Customary and known equipment customarily used in the semiconductor industry can be used for carrying out the process of the invention.

EXAMPLE

The Manufacture of Patterned Photoresist Layers Having Features with Line-Space Dimensions of 20 nm with an Aspect Ratio of 50 Using Surfactants A The suitability of homologues of tris(pentafluoroethyl)methane sulfonic acid sodium salt and tris(heptafluoroprop-1-yl)methane sulfonic acid sodium salt as surfactants for chemical rinse solutions was tested as follows.

1. Static Surface Tension:

The static surface tension was measured measured as described in the American patent application US 2009/0264525 A1, Example 10, Determination of the Surface Tension, page 30, paragraph [0302].

An aqueous solution containing the homologue tris(pentafluoroethyl)methane sulfonic acid sodium salt in a concentration of only 0.4% by weight had a static surface tension of 20.7 mN/m. The critical micellization concentration (CMC) is 0.4% by weight.

An aqueous solution containing tris(heptafluoroprop-1-yl)methane homologue sulfonic acid sodium salt in a concentration of only 0.01% by weight had a static surface tension of 17.5. The CMC was 0.25% by weight.

2. Dynamic Surface Tension:

Both surfactants A caused very fast reduction of the surface tension in the dynamic surface tension test in a bubble tensiometer at concentrations of 0.1% by weight.

3. Foaming Test:

In the foaming test according to the "Tego Norm" they generated significantly less floam than the standard surfactant perfluorooctane sulfonic acid sodium salt.

Consequently, the homologues of tris(heptafluoroprop-1-yl)methane sulfonic acid sodium salt and tris(pentafluoroethyl)methane sulfonic acid sodium salt were excellently suited for chemical rinse solutions.

4. Rinsing Test:

Silicon wafers were provided with 1000 nm thick layers of an immersion photoresist. The photoresist layers were exposed to UV radiation of a wavelength of 193 through a mask using ultrapure water as the immersion liquid. The mask contained features having dimensions of 20 nm. Thereafter, the exposed photoresist layers were baked and developed with an aqueous developer solution containing TMAH. The baked and developed photoresist layers were subjected to a chemical rinse treatment using chemical rinse solutions containing either 0.02% by weight of the homologues of tris(pentafluoroethyl)methane sulfonic acid sodium salt or 0.01% by weight of the homologue tris(heptafluoroprop-1-yl)methane sulfonic acid sodium salt. The chemical rinse solutions were applied as puddles. Thereafter, the silicon wafers were spun dry. The dried silicon wafers did not show any watermarks. It could be corroborated by scanning electron microscopy (SEM) and atomic force microscopy (AFM) that the dried patterned photoresist layers having features with line-space dimensions of 20 nm with an aspect ratio of 50 did not show any pattern collapse.

We claim:

1. A process for manufacturing an integrated circuit, the process comprising:
    manufacturing an integrated circuit with a surfactant A, wherein a 1% by weight aqueous solution of the surfactant A has a static surface tension of less than 25 mN/m;
    the surfactant A is of formula II:

    $(DY-)_mE$ (II);

m is an integer of at least 1;
    E is a hydrophilic group selected from the group consisting of an anionic group, a cationic group, and a nonionic group;
    each Y is independently a linker selected from the group consisting of a covalent bond, a silicon atom, a nitrogen atom, a phosphorus atom, an oxygen atom, a sulfur atom, and a bivalent organic linking group L;
    each D is independently a hydrophobic group of formula I:

    $(RfX-)_nB-$ (I);

each n is independently an integer of at least 3;
    each B is independently a multi-valent central moiety;
    each X is independently a linker selected from the group consisting of a covalent bond, a silicon atom, a nitrogen atom, a phosphorus atom, an oxygen atom, a sulfur atom, and a bivalent organic linking group L;
    each Rf is independently a short-chain perfluorinated group selected from the group consisting of trifluoromethyl, pentafluoroethyl, 1-heptafluoropropyl, 2-heptafluoropropyl, and pentafluorosulfanyl; and
    the integrated circuit comprises a pattern having a line-space dimension below 50 nm and an aspect ratio of greater than 3.

2. The process according to claim 1,
    wherein manufacturing the integrated circuit with the surfactant A comprises manufacturing with the surfactant A in an immersion photoresist layer, developing a photoresist layer with a developer solution comprising the surfactant A after the layer has been exposed to actinic radiation through a mask, exposing a photoresist layer to an immersion liquid comprising the surfactant A, rinsing a patterned material layer with a chemical rinse solution comprising the surfactant A, or any combination thereof, with the proviso that if the manufacturing comprises rinsing a patterned material layer, the line-space dimension is 32 nm or less and the aspect ratio is greater than 10.

3. The process according to claim 2, wherein the manufacturing comprises rinsing at least one patterned material layer selected from the group consisting of a patterned developed photoresist layer, a patterned barrier material layer, a patterned multi-stack material layer, and a patterned dielectric material layer.

4. The process according to claim 1, wherein the surfactant A is suitable for preventing pattern collapse, for reducing line edge roughness, for preventing and removing watermark defects, and for reducing defects by removing particles.

5. The process according to claim 1, wherein the integrated circuit has a large-scale integration (LSI), very-large-scale integration (VLSI), or a ultra-large-scale integration (ULSI).

6. A photolithographic process, the process comprising:
    exposing an immersion photoresist layer of a substrate to actinic radiation through a mask and an immersion liquid, thereby obtaining an exposed photoresist layer;
    developing the exposed photoresist layer with a developer solution, thereby obtaining a pattern having a line-space dimension below 50 nm and an aspect ratio greater than 3 on a developed patterned photoresist layer;
    applying a chemical rinse solution to the developed patterned photoresist layer; and
    spin drying the substrate after applying the chemical rinse solution,
    wherein the immersion photoresist layer, the developer solution, the chemical rinse solution, or any combination thereof comprises a surfactant A,
    a 1% by weight aqueous solution of the surfactant A has a static surface tension of less than 25 mN/m, and
    the surfactant A is of formula II:

    $(DY-)_mE$ (II);

m is an integer of at least 1;
    E is a hydrophilic group selected from the group consisting of an anionic group, a cationic group, and a nonionic group;
    each Y is independently a linker selected from the group consisting of a covalent bond, a silicon atom, a nitrogen atom, a phosphorus atom, an oxygen atom, a sulfur atom, and a bivalent organic linking group L;
    each D is independently a hydrophobic group of formula I:

    $(RfX-)_nB-$ (I);

each n is independently an integer of at least 3;
    each B is independently a multi-valent central moiety;
    each X is independently a linker selected from the group consisting of a covalent bond, a silicon atom, a nitrogen atom, a phosphorus atom, an oxygen atom, a sulfur atom, and a bivalent organic linking group L;
    each Rf is independently a short-chain perfluorinated groups Rf selected from the group consisting of trifluoromethyl, pentafluoroethyl, 1-heptafluoropropyl, 2-heptafluoropropyl, and pentafluorosulfanyl.

7. The photolithographic process according to claim 6, wherein the line-space dimension is 32 nm or less and the aspect ratio is greater than 10.

8. The process of claim 1, wherein manufacturing the integrated circuit with the surfactant A comprises manufacturing the integrated circuit with an immersion photoresist layer comprising the surfactant A.

9. The process of claim 1, wherein manufacturing the integrated circuit with the surfactant A comprises manufacturing the integrated circuit with a developer solution comprising the surfactant A.

10. The process of claim 1, wherein manufacturing the integrated circuit with the surfactant A comprises manufacturing the integrated circuit with a chemical rinse solution comprising the surfactant A.

11. The process of claim 1, wherein each B is independently a carbon atom, an alkyl group, a monocyclic or polycyclic cycloalkyl group, or a mononuclear or polynuclear aryl group, optionally comprising at least one heteroatom and/or at least one multiple bond.

12. The process of claim 1, wherein E is a non-ionic group, and wherein the non-ionic group is a hydroxy group, a group comprising a hydroxy group, a cyclic ether group, a linear ether group, or a branched ether group.

13. The process of claim 1, wherein E is an anionic or cationic group.

* * * * *